United States Patent [19]
Tihanyi et al.

[11] Patent Number: 4,859,875
[45] Date of Patent: Aug. 22, 1989

[54] OPTOCOUPLER FOR POWER FET

[75] Inventors: Jenoe Tihanyi; Roland Weber, both of Muenchen, Fed. Rep. of Germany

[73] Assignee: Siemens Aktiengesellschaft, Berlin and Munich, Fed. Rep. of Germany

[21] Appl. No.: 236,076

[22] Filed: Aug. 24, 1988

[30] Foreign Application Priority Data

Aug. 28, 1987 [DE] Fed. Rep. of Germany ....... 3728806

[51] Int. Cl.⁴ .................. H03K 3/42; G02B 27/00
[52] U.S. Cl. .................. 307/311; 307/270; 307/570; 307/565; 307/549; 250/551
[58] Field of Search ............ 307/311, 300, 570, 270, 307/565, 549; 250/551; 357/19, 30

[56] References Cited

U.S. PATENT DOCUMENTS

| 4,268,843 | 5/1981 | Brown et al. | 357/19 |
| 4,390,790 | 6/1983 | Rodriquez | 250/551 |
| 4,647,794 | 3/1987 | Guajardo | 307/311 |
| 4,665,316 | 5/1987 | Hodges | 250/551 |
| 4,754,175 | 6/1988 | Kobayashi et al. | 307/570 |
| 4,755,697 | 7/1988 | Kinzer | 307/570 |
| 4,777,387 | 10/1988 | Collins | 307/270 |
| 4,801,822 | 1/1989 | Idaka et al. | 307/311 |

FOREIGN PATENT DOCUMENTS

| 0048146 | 9/1981 | European Pat. Off. | |
| 0100017 | 5/1987 | Japan | 307/311 |
| 0132422 | 6/1987 | Japan | 307/311 |

Primary Examiner—Stanley D. Miller
Assistant Examiner—Nancy Thai
Attorney, Agent, or Firm—John F. Moran

[57] ABSTRACT

A power FET is driven by a photodiode chain across a switch, which has two FETs (5, 6) arranged in series. Upon illumination the first FET (5) is driven to be conducting, which permits current to flow from a capacitor (C) connected to a fixed voltage into the gate-source capacitor ($C_{GS}$) of the power FET (1) and to switch it on rapidly. Upon cessation of the illumination, the first FET (5) is blocked while the second FET (6) is driven to be conducting. Hence, the $C_{GS}$ of the power FET is discharged and the power FET is blocked.

4 Claims, 1 Drawing Sheet

OPTOCOUPLER FOR POWER FET

BACKGROUND OF THE INVENTION

The present invention relates to an optocoupler of the type having at least one light-emitting diode (LED) and one single photodiode chain optically coupled to the LED, and it, more particularly relates to this type of optocoupler wherein two FETs are connected in series each having a first and second connection, whose gate terminals and first terminals are connected to each other, and the first connection of the photodiode chain being connected to the gate connections.

Such a type of optocoupler has been described, for example, in the European Patent Application No. 48146. The energy for driving the FETs is solely derived from the photodiode chain. Upon illumination across a LED the photodiode chain generates a voltage, which drives the first of the mentioned FETs conducting. The second FET is blocked upon illumination of the photodiode chain. A load current then flows through the first FET and the integrated diode of the second FET. When the illumination stops the second FET becomes conducting and the first FET is blocked (non-conducting). The load current then flows through the second FET and through the integrated diode of the first FET.

The current supplied by the photodiode chain, in general, amounts to only a few microamperes. This means that the first FET can only be switched on rather slowly.

SUMMARY OF THE INVENTION

It is an object of the invention to provide an optocoupler of the foregoing described nature in such manner that switching can take place more rapidly.

Such an optocoupler in accordance with the present invention includes:

(a) a first FET being of an enhancement type and of the first channel type;

(b) a second FET being of an enhancement type and of the second channel type;

(c) a first connection of a photodiode chain is via a first diode to a second terminal of the first FET;

(d) the second connection of the photodiode chain is connected to a second terminal of a second FET;

(e) a diode is poled in such a way, that upon illumination of the photodiode chain a photocurrent can flow through the first FET;

(f) first connections of the two FETs are connected to the gate terminal of a power FET;

(g) the second connection of the second FET is connected to the source connection of the power FET;

(h) the second terminal of the first FET is connected to a capacitor;

(i) the capacitor is connected via a second diode to a fixed voltage; and (j) the second diode is poled in such a way, that the capacitor is charged when the power FET is blocked.

BRIEF DESCRIPTION OF THE DRAWING

The invention is explained in greater detail in conjunction with two illustrative embodiments with reference to the circuit diagram presented by FIG. 1 and FIG. 2.

DETAILED DESCRIPTION

Figure 1:
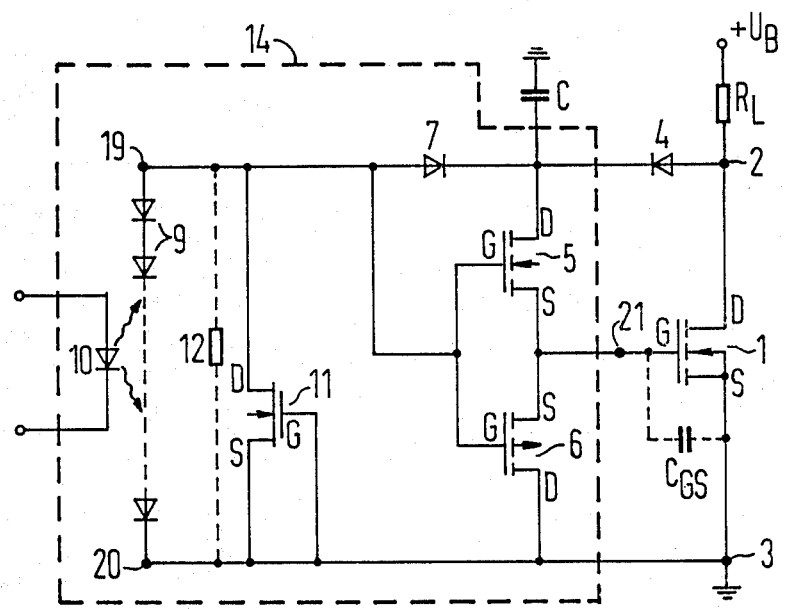

The optocoupler according to FIG. 1 contains a power FET 1. Its drain terminal D is connected to a circuit terminal 2, its source terminal S is connected to a circuit terminal 3. Terminal 2 is connected via a load resistor $R_L$ to an operating voltage source with voltage $+U_B$. Terminal 3 is maintained at a negative voltage or at ground potential. The gate terminal G is connected to the first terminals of two FETs 5, 6. These first terminals are actually the source terminals S which are also electrically connected to each other. FET 5 is an n-channel FET, and FET 6 is a p-channel FET. Both are of the enhancement type. The second terminal of FET 5, in this case the drain connection, is connected via diode 7 to the first connection 19 of a photodiode chain. In this illustrative embodiment this is the anode connection. The second terminal of FET 6, in this case the drain terminal D, is connected to the second circuit terminal 3 and to the second connection 20 of the photodiode chain 9. Connection 20 is here the cathode connection of the photodiode chain. The gate connections G of FETs 5 and 6 are connected to each other and to the first connection 19 of the photodiode chain 9. The photodiode chain 9 is optically coupled to an LED 10.

The second terminal D of the first FET 5 is connected to one terminal of a capacitor C. Its other terminal is, for example, at ground or at a negative potential. Between the drain terminal D of FET 1 and the second terminal D of FET 5 lies diode 4. This is poled so that the capacitor C can be positively charged across the load resistor $R_L$. Diode 7 is poled in such a way, that upon illumination of the photodiode chain 9 a photocurrent will flow through FET 5.

Between the gate terminals G and the second connection D of FET 6 lies the load path of an FET 11. This is an n-channel FET of the depletion type. Here, the source connection S is connected to the gate connection G. Both are at the second connection of FET 6 respectively at terminal 3 repectively at the second connection 20 of the photodiode chain 9. FET 11 may also be replaced by a resistor 12, whose optional connection leads are indicated by dotted lines.

Upon illumination of the photodiode chain 9, a current flows from connection 19 into the gate terminals of FETs 5 and 6. FET 5 is driven to be conducting while FET 6 is blocked. The conducting FET 5 discharges capacitor C, the discharge current of which flows into the gate-source capacitor $C_{GS}$ (symbolically illustrated) of FET 1. The capacity of capacitor C is selected that the stored charge charges the $C_{GS}$ of FET 1 rapidly. It amounts to, for eample, 10 nF (nanofarad). Power FET 1 is now driven into conducting quickly and the load current will flow through load $R_L$.

FET 5 and the power FET 1 remain conducting for as long as the photodiode chain 9 is illuminated. A photocurrent flows through diode 7 and FET 5 in $C_{GS}$ of FET 1 and keeps it charged. The photocurrent, here, only needs to be as large as the leakage current of $C_{GS}$.

Upon cessation of the illumination, the gate-source capacitor of FET 5 will discharge through FET 11, or respectively, resistor 12 and FET 5 is blocked. Simultaneously, the second FET 6 is driven conducting, which brings about discharge of the $C_{GS}$ of the power FET 1 and the latter becomes blocked.

In view of the stated polarity of the voltages, the power FET 1 is an n-channel FET. At a different polarity of the voltage, FETs of the complementary channel may also be used to advantage. If FETs 5 and 6 are lateral FETs, the drain terminals D would also be connected with each other, for example, and the source connections S with capacitor C respectively terminal 3. The voltage at both connections differs in the conducting state maximally by the operating voltage of the particular FET.

For optimum functioning of the circuit, it is advisable to dimension the circuit so that the photovoltage minus the starting voltage of diode 7 minus the starting voltage of FET 5 is greater than the starting voltage of FET 1. The absolute starting voltage of FET 6 must be smaller than the absolute starting voltage of power FET 1. FET 11 is so dimensioned, that its current is significantly smaller than the photocurrent, for example 1 uA.

Figure 2:
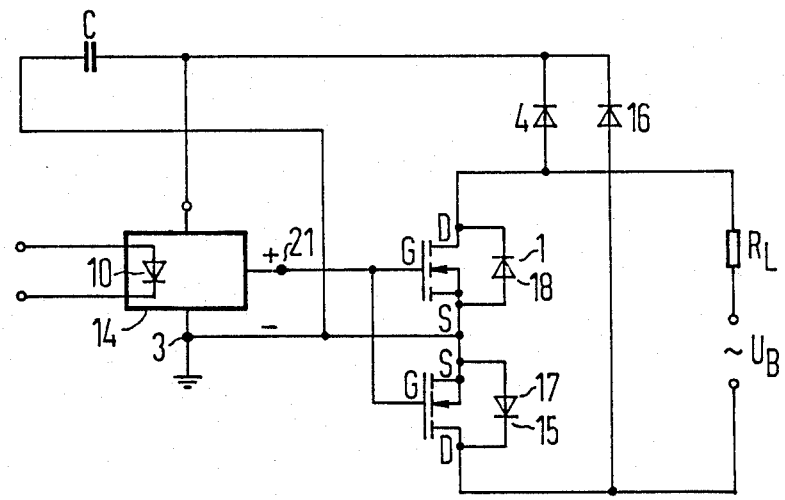

The optocoupler in accordance with FIG. 1 can be used for operation on a dc voltage. An optocoupler for ac voltage is illustrated in FIG. 2. Identical or functionally identical parts are provided with the identical reference numbers as in FIG. 1. The optocoupler according to FIG. 2 further includes a second power FET 15. The source terminal of FET 15 is connected to the source terminal S of FET 1. The drain terminal D of 15 is connected at a terminal of an ac voltage, while the drain terminal of D is connected across load $R_L$ to the other terminal of this ac voltage source. The source terminals S are connected in common to terminal 3, i.e. to ground. The gate connections G are connected with each other and to terminal 21 of the drive circuit 14. This portion is enclosed in FIG. 1 by the dotted line. Capacitor C is charged during a first half-wave by diode 4 and in the other half-wave by diode 16, which is connected to the drain connection of the power FET 15. For proper function it is essential, that both power FETs 1 and 15 contain an integrated diode 18 respectively 17, whose anode zone is formed by the source zone and whose cathode zone is formed by the drain zone of the particular power FET. These diodes are component part of each power FET.

Upon illumination of the photodiode chain in drive circuit 14, a positive potential appears at terminal 21 and the capacitor C can discharge into the gate-source capacitor of FET 1. This is thereby rapidly controlled to charge and a current flows through load $R_L$, through FET 1, and through diode 17 of FET 15 to the other terminal of the ac voltage source. During the second half-wave the current flows through FET 15 and diode 18 of FET 1 into load $R_L$. Upon cessation of illumination both power FETs are blocked across FET 6 of the drive circuit 14.

The drive circuit 14 may be implemented in integrated form in the technology of dielectric isolation as described, for example, the aforementioned European Patent Application EP-A1-48146.

The foregoing described illustrative embodiments of the present invention are examples of specific implementations in accordance with the inventive principles. It is to be understood that numerous and varied other modifications will occur to those skilled in the art in accordance with these inventive principles. In such cases, the invention is only restricted by the following claims wherein it is defined.

We claim:

1. An optocoupler having at least one LED and one single photodiode chain optically coupled with the LED and two series-connected FETs each having a first terminal and a second terminal and a gate terminal, the first terminals are connected to each other while the gate terminals are connected to each other to form a common terminal, a first terminal of the photodiode chain is connected to the common terminal, the optocoupler comprising:
    (a) the first FET being of an enhancement type and of a first channel type,
    (b) the second FET being of an enhancement type and of a second channel type,
    (c) a first diode is connected from the first terminal of the photodiode chain and common terminal to the second terminal of the first FET,
    (d) a second terminal of the photodiode chain is connected to the second terminal of the second FET,
    (e) the first diode is poled so that upon illumination of the photodiode chain a photocurrent will flow through the first FET,
    (f) the first terminals of the FETs are connected to the gate terminal of a power FET,
    (g) the second terminal of the second FET is connected to the source terminal of the power FET,
    (h) a capacitor is connected to the second terminal (D) of the first FET and a fixed voltage potential,
    (i) a second diode is connected between the power FET and the capacitor, and
    (j) the second diode is poled in such a way, that the capacitor is charged when the power FET is blocked.

2. An optocoupler in accordance with claim 1, wherein a resistor from a voltage potential source for the power FET charges the capacitor.

3. An optocoupler in accordance with claim 1, further comprising a resistor between first and second terminals of the photodiode chain.

4. An optocoupler in accordance with claim 1, further comprising a depletion type FET which is connected between the common terminal of the FETs and the second terminal of the second FET, a gate terminal and source terminal of said depletion type FET are connected to the second terminal of the second FET.

* * * * *